US007236361B2

(12) United States Patent
Cote et al.

(10) Patent No.: US 7,236,361 B2
(45) Date of Patent: Jun. 26, 2007

(54) FAN ASSEMBLY FOR INSTALLING AND REMOVING FANS INDIVIDUALLY AND COLLECTIVELY

(75) Inventors: Gerald J. Cote, Westborough, MA (US); Maida Boudreau, Brimfield, MA (US); W. Brian Cunningham, Westborough, MA (US); Adrianna D. Bailey, Upton, MA (US)

(73) Assignee: EMC Corporation, Hopkinton, MA (US)

( * ) Notice: Subject to any disclaimer, the term of this patent is extended or adjusted under 35 U.S.C. 154(b) by 363 days.

(21) Appl. No.: 10/852,789

(22) Filed: May 25, 2004

(65) Prior Publication Data

US 2005/0135060 A1   Jun. 23, 2005

Related U.S. Application Data

(63) Continuation-in-part of application No. 10/745,100, filed on Dec. 22, 2003, now Pat. No. 7,145,776.

(51) Int. Cl.
    *H05K 7/20* (2006.01)
(52) U.S. Cl. ............... 361/695; 361/687; 165/80.3; 454/184
(58) Field of Classification Search ............... 361/695
    See application file for complete search history.

(56) References Cited

U.S. PATENT DOCUMENTS

| 5,603,056 | A | | 2/1997 | Totani |
| 5,673,132 | A | | 9/1997 | Carbone, Jr. et al. |
| 5,793,610 | A | * | 8/1998 | Schmitt et al. ............. 361/695 |
| 5,890,214 | A | | 3/1999 | Espy et al. |
| 5,901,151 | A | | 5/1999 | Bleiwiess et al. |
| 6,011,689 | A | * | 1/2000 | Wrycraft .................... 361/695 |
| 6,031,717 | A | * | 2/2000 | Baddour et al. ............ 361/687 |
| 6,042,348 | A | * | 3/2000 | Aakalu et al. ........... 417/423.5 |
| 6,174,232 | B1 | * | 1/2001 | Stoll et al. .................. 454/184 |
| 6,317,800 | B1 | | 11/2001 | Westby et al. |
| 6,421,711 | B1 | | 7/2002 | Blumenau et al. |
| 6,425,049 | B1 | | 7/2002 | Yamamoto et al. |
| 6,430,714 | B1 | | 8/2002 | McAdam et al. |
| 6,473,301 | B1 | | 10/2002 | Levy et al. |
| 6,587,340 | B2 | * | 7/2003 | Grouell et al. .............. 361/695 |
| 6,603,661 | B2 | * | 8/2003 | Smith et al. ................ 361/695 |
| 6,616,525 | B1 | * | 9/2003 | Giraldo et al. ............. 454/184 |
| 6,633,486 | B2 | * | 10/2003 | Coles et al. ................ 361/726 |

(Continued)

*Primary Examiner*—Anatoly Vortman
*Assistant Examiner*—Anthony Q. Edwards
(74) *Attorney, Agent, or Firm*—Guerin & Rodriguez, LLP; Michael A. Rodriguez

(57) ABSTRACT

Described is a fan assembly constructed to enable fans to be installed and removed from a storage enclosure individually or collectively. The fan assembly has a plurality of fan packs and a support frame that includes a plurality of wells for holding fan packs. Each fan pack includes a fan and a fan mount attached to the fan, and each fan pack is disposed in one of the plurality of wells. A first latch-and-release mechanism secures one of the fan packs to the side walls of the well within which that fan pack is disposed. The first latch-and release mechanism enables that fan pack to be removed individually from the fan assembly. A second latch-and release mechanism secures the support frame to opposing side walls of an enclosure. The second latch-and-release mechanism enables the fan assembly to be removed from the enclosure while populated with the plurality of fan packs.

12 Claims, 16 Drawing Sheets

U.S. PATENT DOCUMENTS 6,808,411 B2 * 10/2004 Chen .......................... 439/485
2002/0044562 A1    4/2002 Killen, Jr. et al.
2003/0091433 A1 *  5/2003 Tam et al. .................. 415/146

* cited by examiner

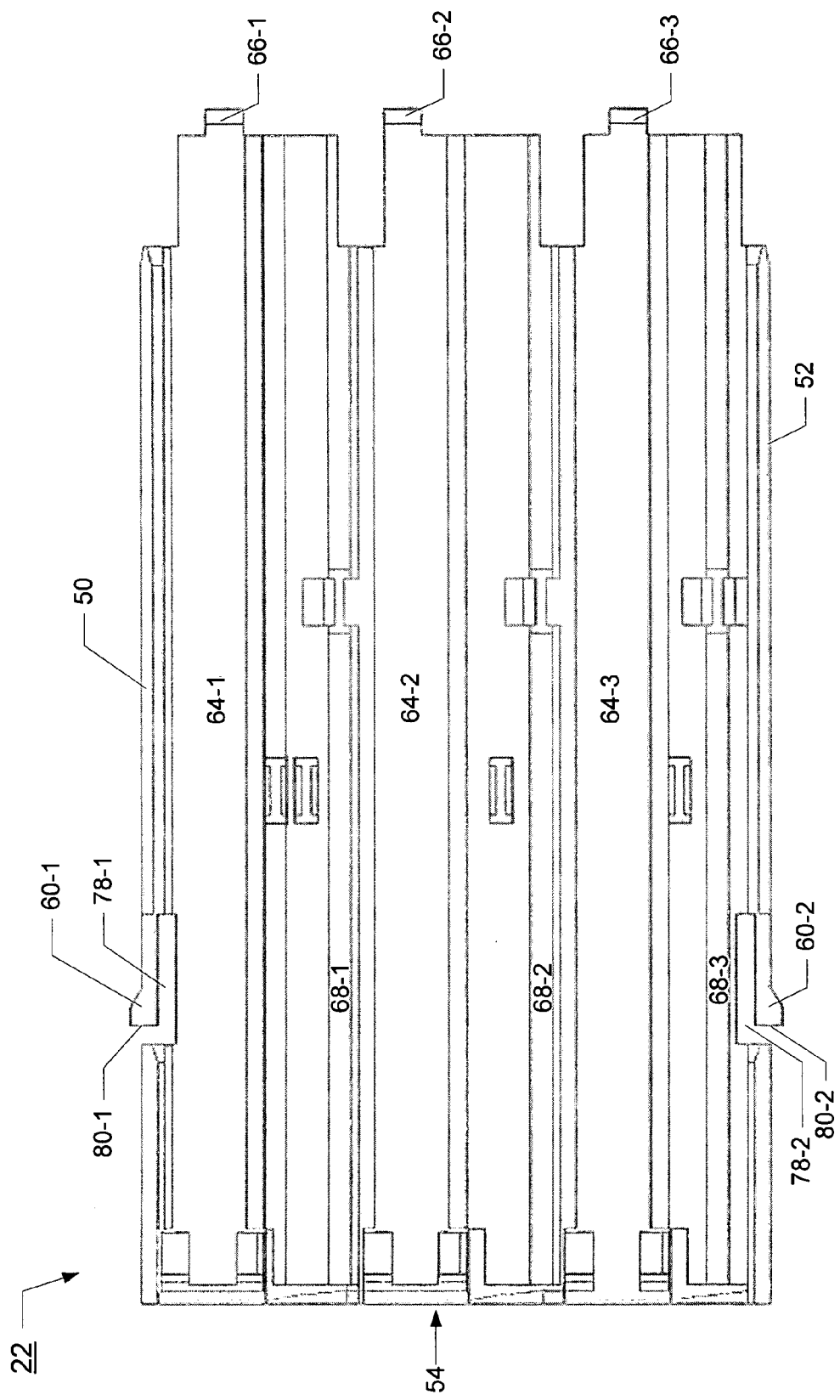

FAN ASSEMBLY FOR INSTALLING AND REMOVING FANS INDIVIDUALLY AND COLLECTIVELY

RELATED APPLICATION

This application is a continuation-in-part application claiming priority to U.S. patent applicaton Ser. No. 10/745,100, filed Dec. 22, 2003, now U.S. Pat. No. 7,145,776 and titled "Midplane-less Data Storage Enclosure," the entirety of which patent application is incorporated by reference herein.

FIELD OF THE INVENTION

The invention relates generally to data storage systems. More particularly, the invention relates to a fan assembly for cooling electronics in the data storage system.

BACKGROUND

Critical to the proper operation of electronic systems is temperature control. The electronic components in these systems can generate much heat, which, unless quickly dissipated, can negatively affect the operational characteristics of those and other components and lead to system failure. Consequently, most electronic systems house one or more fans for moving air over the electronic components.

Because of their role in temperature control, proper operation of the fans is essential to the proper operation of the electronic system. Occasionally a fan may malfunction. Usually, in such an instance, other fans in the electronic system are able to move sufficient air to keep the system operational. However, the malfunctioning fan may undermine the effectiveness of any remaining fans by providing a path for back drafts. Consequently, the malfunctioning fan needs to be removed and replaced easily and quickly.

SUMMARY

In one aspect, the invention features a fan assembly having a support frame with a base, a front wall extending perpendicular to the base, and a plurality of spatially separated side walls perpendicular to the base and to the front wall. The base, front wall, and side walls define a plurality of wells. The fan assembly also has a plurality of fan packs. Each fan pack includes a fan and a fan mount attached to the fan. Each fan pack is disposed in one of the plurality of wells. A first latch-and-release mechanism secures one of the fan packs to the side walls of the well within which that fan pack is disposed. The first latch-and release mechanism enables the fan pack to be removed individually from the fan assembly. A second latch-and release mechanism secures the support frame to opposing side walls of an enclosure. The second latch-and-release mechanism enables the fan assembly to be removed from the enclosure while populated with the plurality of fan packs.

In another aspect, the invention features a fan pack including a fan and a fan mount. The fan mount has a rear frame that is attached to one side of the fan. A flap mechanism is pivotally attached to the rear frame for rotational movement between a closed position and a fully open position. When in the closed position, the flap mechanism covers the rear frame. When in the fully open position, the flap mechanism extends away from the rear frame at an angle of less than 90 degrees with respect to the rear frame to ensure that any back draft urges the flap mechanism towards the closed position.

BRIEF DESCRIPTION OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

FIG. 3B is a side view of the opposite side of the embodiment of the disk-drive guide of FIG. 2.

DETAILED DESCRIPTION

Fan assemblies constructed in accordance with the invention permit the removal and replacement of fans individually or collectively as an entire unit. In brief overview, the fan assembly of the invention holds a plurality of fan mounts, each having a fan. Each fan mount is individually installable into and removable from the fan assembly. The fan assembly is installable into and removable from a data storage enclosure, either populated or unpopulated with fan mounts. When installed in the storage enclosure and populated with fan mounts, the fans cooperatively move air over the electronic components of the storage enclosure.

Figure 1:
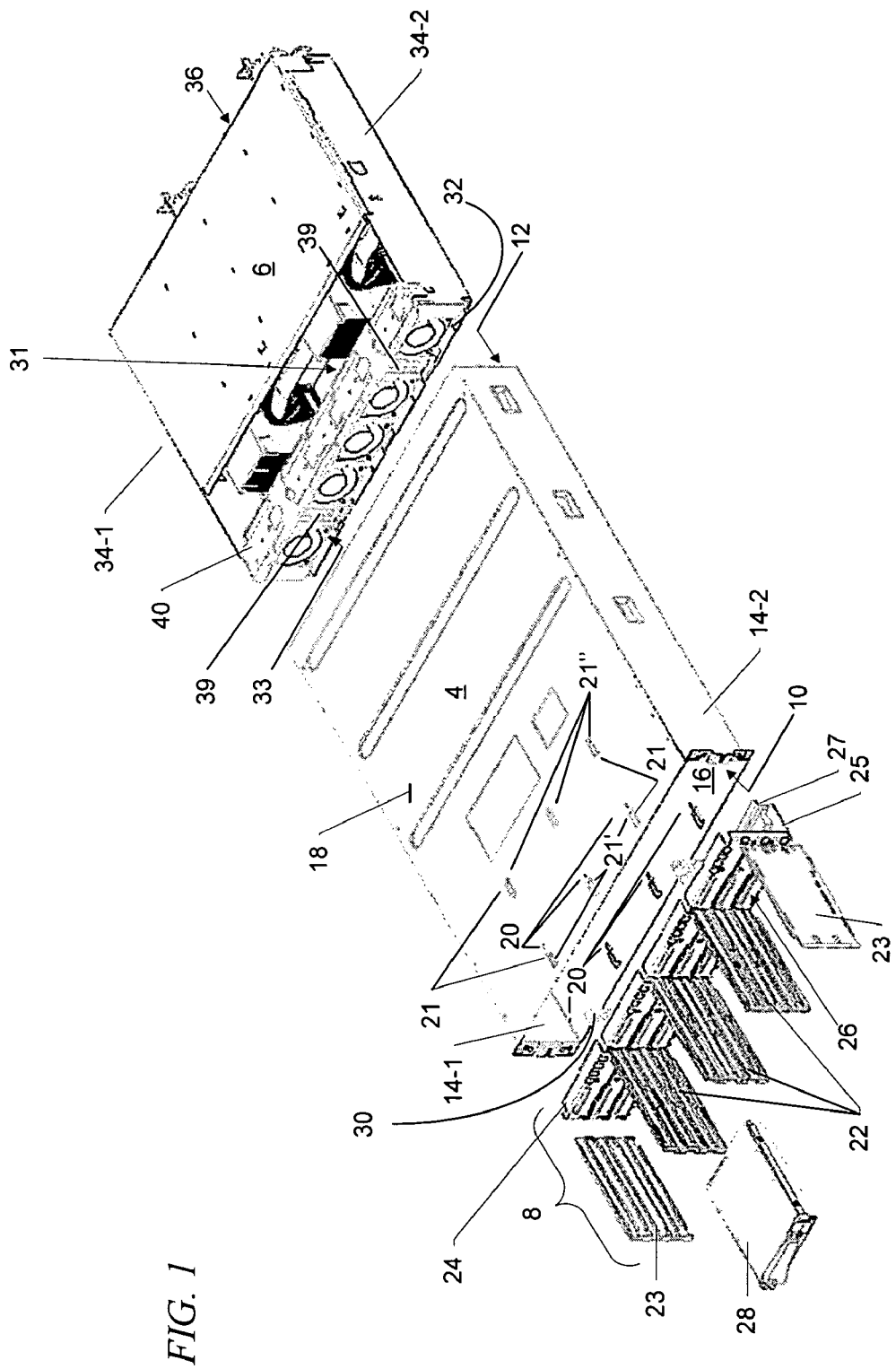
FIG. 1 is an exploded view of an embodiment of a data storage enclosure.

FIG. 1 shows an exploded view of a midplane-less data storage enclosure 2 with a fan assembly of the present invention. Fully assembled, one embodiment of the data storage enclosure 2 has a front-to-back dimension of approximately 26 inches and a width of approximately 17¾ inches. The data storage enclosure 2 includes a chassis 4 for housing a control board module 6 connected to a bulkhead assembly 8. The chassis 4 has an open front end 10, and open back end 12, a pair of side walls 14-1, 14-2, a bottom surface 16, and a top surface 18. In one embodiment, the chassis 4 is constructed of electrically conductive material such as sheet metal.

Near the front end 10 of the chassis 4, the bottom and top surfaces 16, 18 each have a plurality of openings 20 and edge-guides 21. For clarity, only a portion of the openings 20 and edge-guides 21 have reference numerals drawn to them in the figure. The edge-guides 21 are aligned in pairs comprised of a forward edge-guide 21' and a rearward edge-guide 21". On each surface 16, 18, each opening 20 is aligned between each pair of edge-guides 21', 21". For purposes of this description, the use of terms such as top, bottom, side, front, back, forward, rearward, vertical, and lateral, is with respect to the horizontal orientation of the data storage enclosure 2 as shown in FIG. 1. It is to be understood that such terms are relative to the particular orientation of the enclosure 2, and are not intended to place a restriction upon the orientation of the enclosure 2 when deployed in its field of operation.

The bulkhead assembly 8 includes a plurality of spatially separated inner disk-drive guides 22, outer disk-drive guides 23, and a G-shaped bulkhead 24. One end of each inner disk-drive guide 22 is attached to the bulkhead 24, and the edges of the outer disk-drive guides 23 are attached to the chassis 4. The planes of disk-drive guides 22, 23 are generally parallel to each other and extend generally perpendicularly away from a front wall 26 of the bulkhead 24. Opposing surfaces of each pair of adjacent disk-drive guides 22, 23 define storage disk-drive slots. Each storage disk-drive slot closely receives a storage disk drive 28. In the embodiment shown, the bulkhead assembly 8 includes five storage disk-drive guides 22, 23 that divide the bulkhead 24 into four sections or columns, each section defining slots for three storage disk-drives for 12 storage disk drives in all. In one embodiment, the storage disk drives 28 are Serial Advanced Technology Attachment (SATA) drives, and the lateral spacing between adjacent disk-drive guides 22, 23 is such that each storage disk-drive slot closely receives an ATA drive. Other types of storage disk-drives, such as parallel ATA (PATA) and Fibre Channel, can be used without departing from the principles of the invention.

Extending perpendicularly from a rear face of the bulkhead 24 is a plurality of light-pipes 30. Edge connectors 25, of which only one is seen in FIG. 1, extend from a rear wall of the G-shaped bulkhead 24.

In general, the control board module 6 includes redundant storage processors (not shown) and attendant circuitry, for writing data to and reading data from the storage disk drives 28 inserted into slots of the bulkhead assembly 8, and redundant power supplies for powering the storage processors and disk drives 28. The control board module 6 includes a processor board 31 to which the power supplies and storage processors are electrically connected, a plurality of electrical finger connectors 32 extending from an edge 33 of the processor board 31, side walls 34-1, 34-2, a rear wall 36, and a top portion 38. A fan assembly 40 extends between the side walls 34-1, 34-2 at the edge 33 of the processor board 31. The lateral and vertical dimensions of the control board module 6 are such that the control board module 6 fits closely within the chassis 4.

To assemble the enclosure 2, the bulkhead assembly 8 slides into the open front end 10 of the chassis 4 and the control board module 6 slides into the chassis 4 through the open back end 12. (The three inner disk-drive guides 22 are typically attached before the bulkhead assembly 8 is inserted into the chassis 4, and the two outer disk-drive guides 23 are attached after the bulkhead assembly 8 is inserted into the chassis 4.) The edge connectors 32 attach to the edge connectors 25 of the bulkhead 24, to secure the control board module 6 to the bulkhead assembly 8. The light pipes 30 extending from the bulkhead 24 align with the LED modules 39. Within the chassis 4, the generally G-shape of the bulkhead 24 provides a plenum in front of the fan assembly 40. In one embodiment, the distance from the front wall 26 of the bulkhead 24 to the front of the fan assembly 40 is approximately 1.5 inches. During operation, the fans draw air from the front end 10 of the chassis 4 to the back end 12. The air passes over and below the storage disk drives 28 through openings in the wall 26 of the bulkhead 24, through the plenum, and into the control board module 6.

Figure 2:
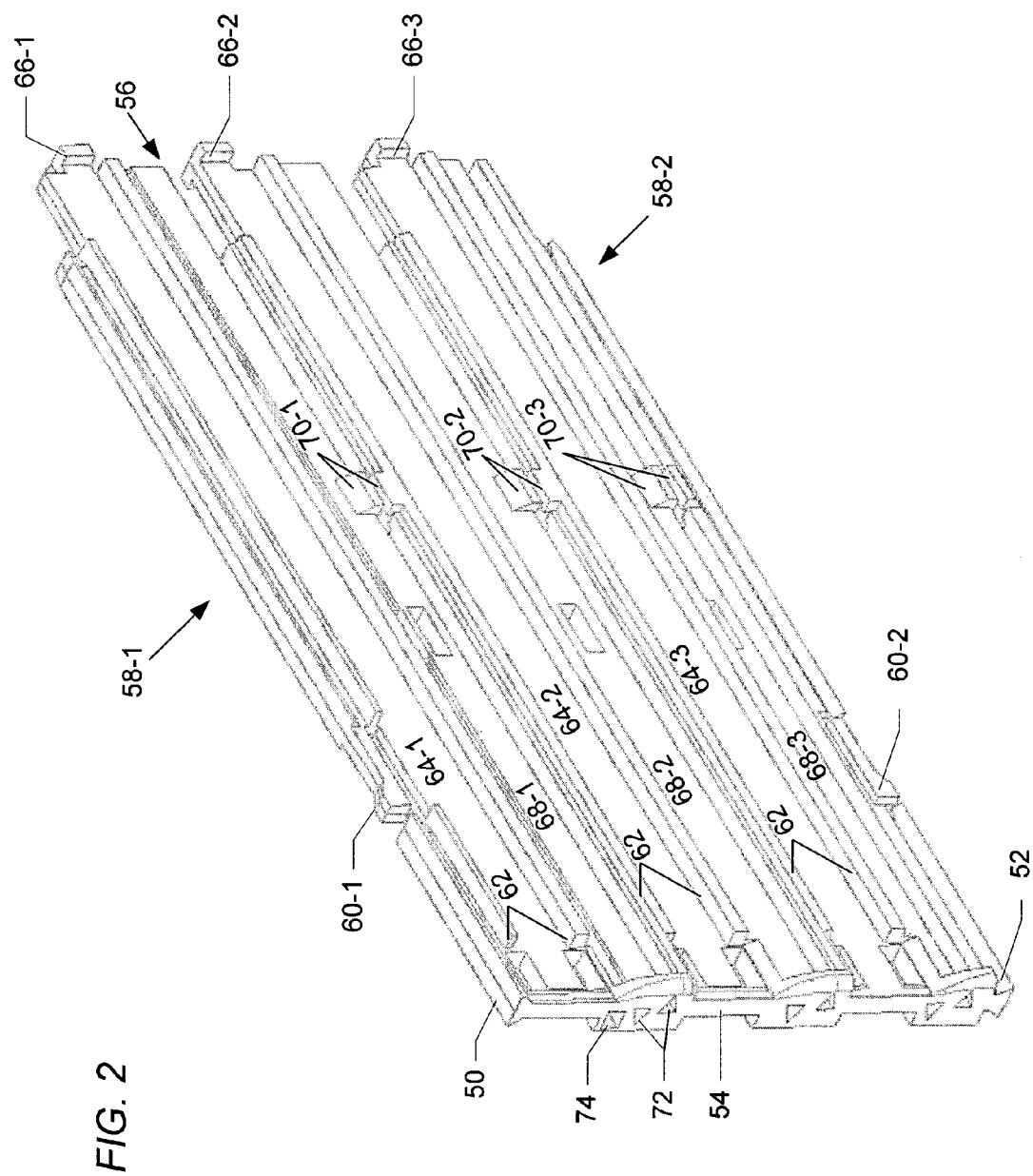
FIG. 2 is an isometric view of an embodiment of a disk-drive guide.

FIG. 2 shows an isometric side view of an embodiment of a disk-drive guide 22 including a beveled top edge 50, a beveled bottom edge 52, a front face 54, a back end 56, and opposite sides 58-1, 58-2. Each outer disk-drive guide 23 has features similar to those described below for the disk-drive guide 22, with particular differences being noted. In one embodiment, each disk-drive guide 22, 23 is made of plastic material. Each beveled edge 50, 52 has a resilient tab 60-1, 60-2, respectively. The locations of the tabs 60-1, 60-2 on their respective edges 50, 52 correspond to the locations of the openings 20 in the top and bottom surfaces 18, 16 of the chassis 4. Each side 58-1, 58-2 has a plurality of pairs of raised ridges 62 extending for part of the length of the disk-drive guide 22, 23 (one of the sides 58-1, 58-2 of each outer disk-drive guide 23 can be planar, i.e., the outer side can be without groove-defining ridges). Each pair of raised ridges 62 defines a groove 64 for slidably receiving a lip or an edge of a storage disk drive 28. In the embodiment shown, the raised ridges 62 define three grooves 64-1, 64-2, 64-3 for three storage disk drives 28. Each storage disk drive 28 enters one of the grooves 64 from the front face 54 of the disk-drive guide 22, 23.

Extending from the back end 56 from each inner disk-drive guide 22, at the end of each groove 64-1, 64-2, 64-3, is a T-shaped tab 66-1, 66-2, 66-3, respectively (generally T-shaped tab 66). As described in more detail below, each T-shaped tab 66 enters an opening in the front wall 26 of the bulkhead 24 and slides into a locking position within the opening to secure the disk-drive guide 22 to the bulkhead 24. In one embodiment, the outer disk-drive guides 23 abut but do not attach to the bulkhead 24 when installed in the chassis 4, and accordingly do not have tabs corresponding to the tabs 66 of the disk-drive guides 22. In another embodiment, the outer disk-drive guides 23 have tabs that project through and secure to the bulkhead 24.

Each side 58-1, 58-2 also has a plurality of channels 68-1, 68-2, 68-3 (generally, channel 68) extending lengthwise through that side from the front face 54 to the back end 56. Each channel 68 receives a light-pipe (not shown). Tab pair 70 constrains the light-pipe 30 within the channel 68. Each light-pipe 30 enters the inner disk-drive guide 22 from the back end 56 and abuts an arrow-shaped window 72 or to a rectangular window 74 in the front face 54. Each window 72, 74 is a transparent region of the front face 54. Light emanating from an arrow-shaped window 72 serves to indicate the operational status of the storage disk drive 28 towards which that arrowed window 72 is generally pointing. The rectangular window 74 indicates an operational status (e.g., system fault or system operational) of the data storage enclosure 2. The light originates from LEDs on the control board module 6 and travels through the light-pipes 30 embedded in the channels 68 of the disk-drive guide 22. Although formed with light-pipe channels 68, whether a particular disk-drive guide 22 has any installed light-pipes 30 depends upon the location of that disk-drive guide 22 in the bulkhead assembly 8. For example, in the embodiment shown, the inner disk-drive guide 22 at the center of the bulkhead assembly 8 does not have light-pipes 30. Similarly the outer disk-drive guides 23 do not carry light-pipes (and may be constructed without channels 68). Accordingly, the front faces 54 of these particular disk-drive guides 22, 23 can be constructed without windows 72, 74.

Figure 3A:
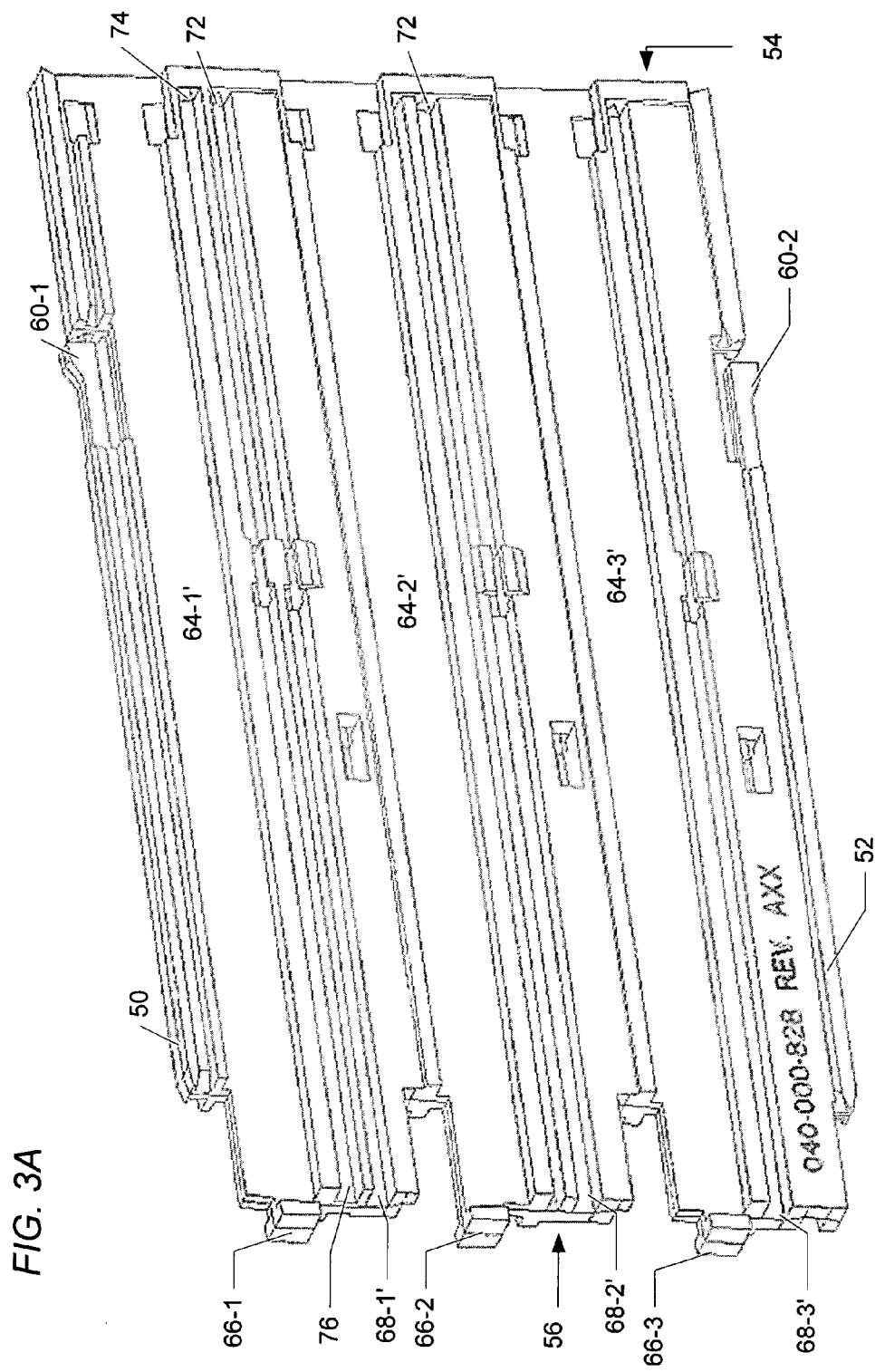
FIG. 3A is a side view of a first side of the embodiment of the disk-drive guide of FIG. 2.

FIG. 3A and FIG. 3B show the inner disk-drive guide 22 from the one side 58-1 and the opposite side 58-2, respectively. FIG. 3A shows grooves 64-1', 64-2', and 64-3' (generally, groove 64'), each for receiving an edge of a storage disk drive 28. Each groove 64' is located opposite a corresponding groove 64 on the other side 58-2 of the disk-drive guide 22. The side 58-1 also has a plurality of light-pipe channels 68-1', 68-2', and 68-3' extending the length of the disk-drive guide 22, from the back end 56 to the front face 54, and ending at an arrowed window 72. An additional light-pipe channel 76 in the side 58-1 extends to the rectangular window 74.

The view provided in FIG. 3B of the other side 58-2 illustrates the projection of the resilient tab 60-1 above the top edge 50 and of the resilient tab 60-2 below the bottom edge 52. Behind each resilient tab 60 is an open region 78-1, 78-2 into which the respective tab 60-1, 60-2 bends upon coming into contact with the top 18 or bottom 16 chassis surface when the bulkhead assembly 8 is slid into the chassis 4. The tabs 60 return to their original shape when the tabs 60 become aligned with the openings 20 in the top 18 and bottom 16 surfaces. By returning to their original shapes, the tabs 60 project into the openings 20. The planar edge 80-1, 80-2 of each tab 60-1, 60-2, respectively, prevents the bulkhead assembly 8 from sliding back out of the chassis 4. Corresponding tabs 60 of the outer disk-drive guides 23 also enter respective openings 20 in the top 18 and bottom 16 surfaces of the chassis 4 to prevent such disk-drive guides 23 from sliding back out of the chassis 4.

Figure 4:
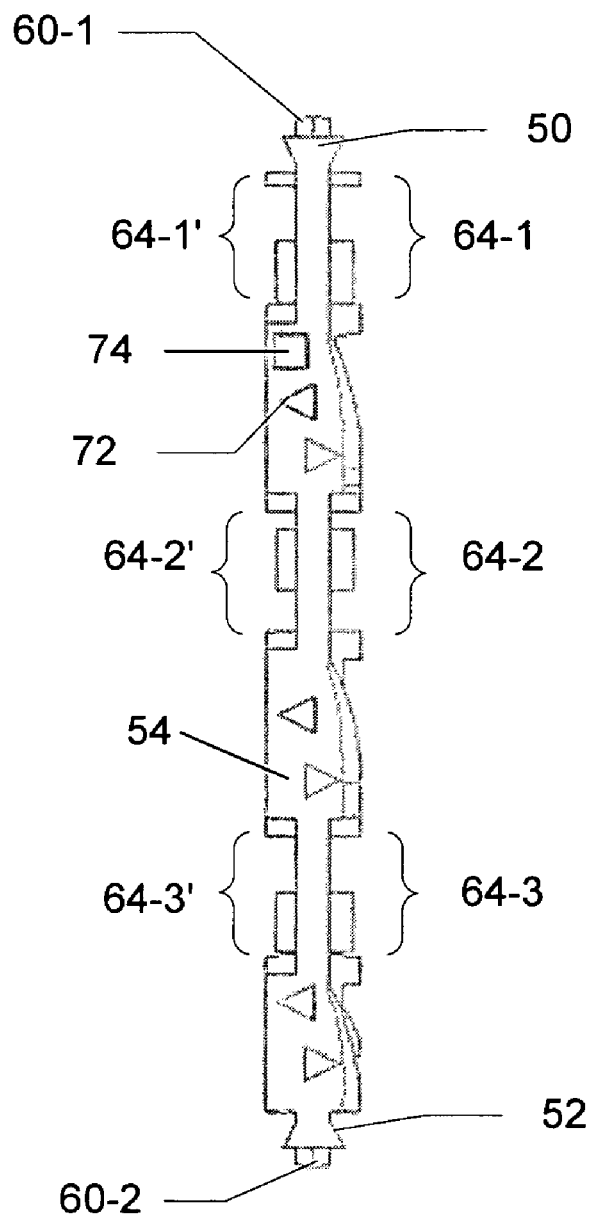
FIG. 4 is a front view of the embodiment of the disk-drive guide of FIG. 2.

FIG. 4 shows a front view of the embodiment of the inner disk-drive guide 22 of FIG. 2. Directed at the front face 54, this front view shows the beveled aspect of the top and bottom edges 50, 52 of the disk-drive guide 22. When the disk-drive guide 22, as part of the bulkhead assembly 8, is slid into the chassis 4, the beveled top edge 50 slides into the forward and rearward edge-guides 21', 21" located on the underside of the top chassis surface 18 and the beveled bottom edge 52 slides into the forward and rearward edge-guides 21', 21" on the topside of the bottom chassis surface 16. The forward and rearward edge-guides 21', 21" restrain the front and back of the disk-drive guide 22, respectively, from moving laterally within the chassis 4. Thus, the tabs 60 and beveled edges 50, 52, in combination with the openings 20 and edge-guides 21, secure the bulkhead assembly 8 to the chassis 4, without the need for mechanical fasteners such as screws and bolts.

Figure 5:
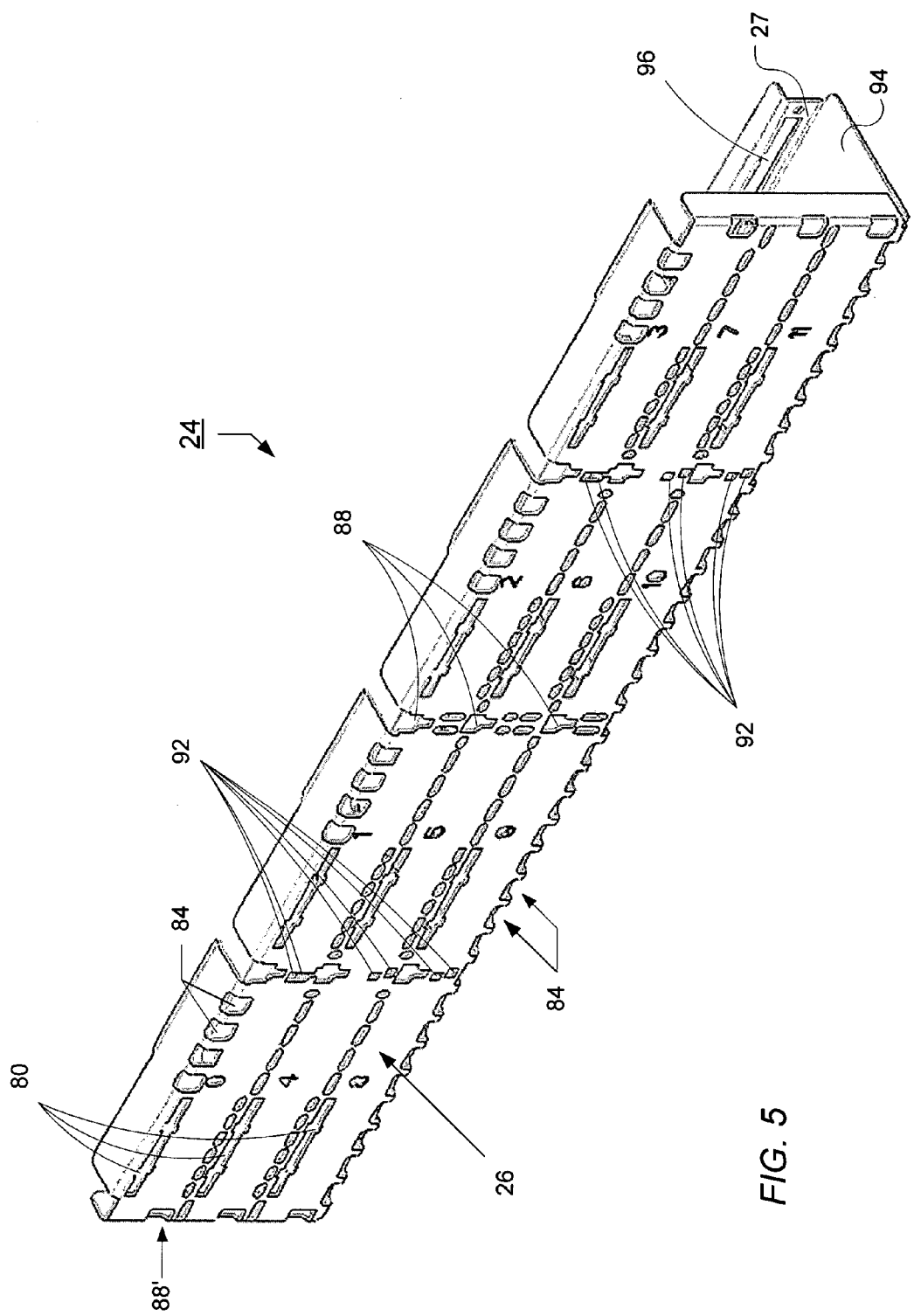
FIG. 5 is an isometric front view of an embodiment of a bulkhead.

FIG. 5 shows an embodiment of the G-shaped bulkhead 24 with the perforated front wall 26, a base surface 27 extending generally perpendicularly from the front wall 26, and a rear wall 94 extending generally perpendicularly from the base surface 27 and opposite the front wall 26. The bulkhead 24 can be constructed of various materials, such as sheet metal or injection molded plastic. Openings 80 are each for receiving an electrical connector that connects to a storage disk drive 28 to be installed in the enclosure 2. This particular embodiment has twelve such openings 80 for twelve storage disk drives 28 (four columns of three), although not all twelve are numbered for the sake of clarity. In one embodiment, the wall 26 of the bulkhead is numbered from 0 to 11 to identify the individual storage disk drive locations. Openings 84 are provided to permit the front-to-back flow of air drawn by the fans in the control board module 6. Only a portion of the openings 84 are numbered.

T-shaped openings 88 are for receiving the T-shaped tabs 66 of the disk-drive guides 22. The dimensions of each T-shaped opening 88 are such that the tab 66 can be inserted completely through the wide portion of the opening 88, and then slid downward into the narrow portion of the opening 88. When that tab 66 is in this locked position, the disk-drive guide 22 cannot slide forward or backward with respect to the bulkhead 24.

Figure 6:
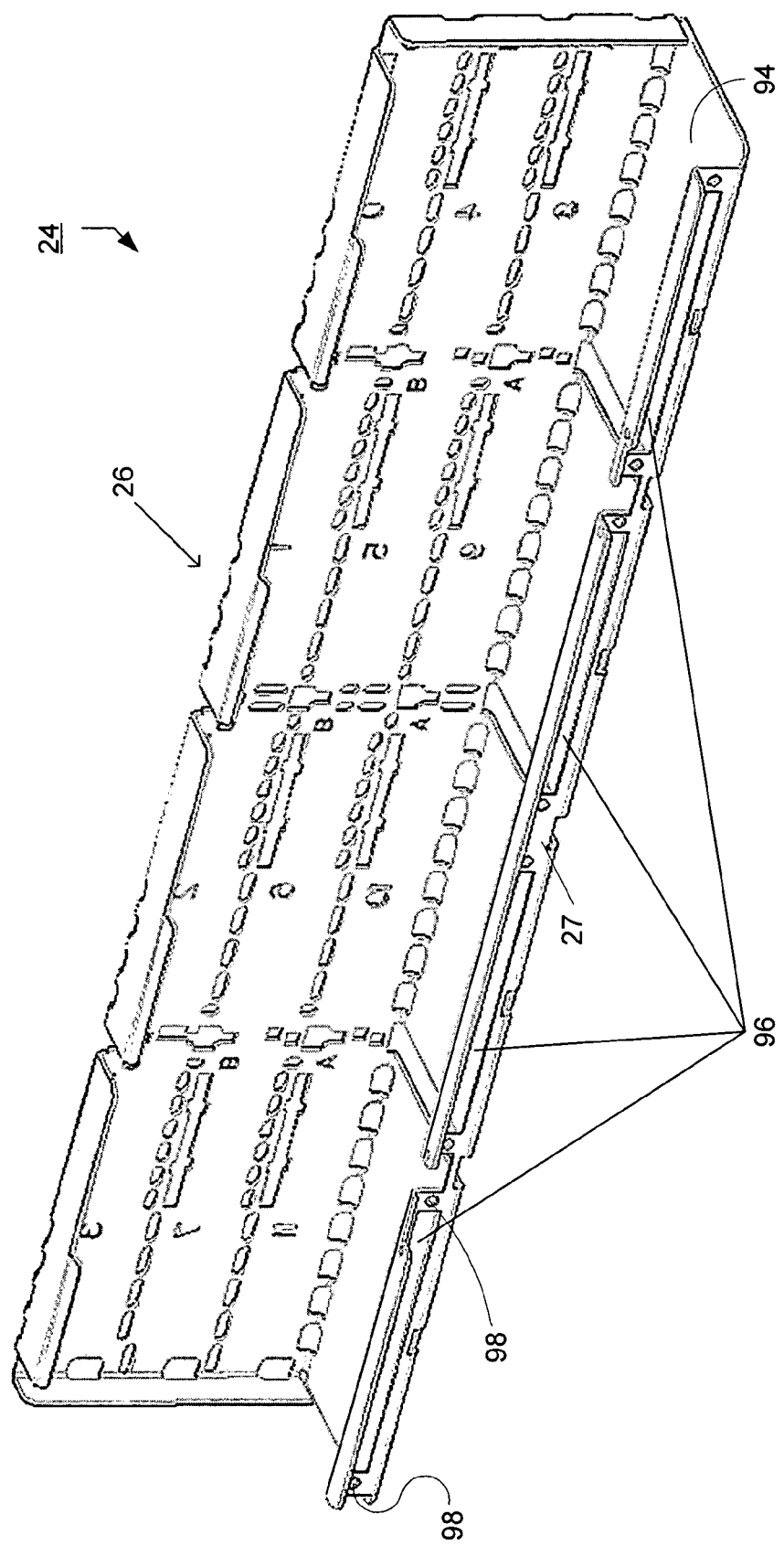
FIG. 6 is a rear view of the embodiment of the bulkhead.

Openings 92 are for receiving the light-pipes 30 (FIG. 1) that extend therethrough from the back side of the bulkhead 24 into the channels 68 of the disk-drive guides 22. In one embodiment, such light-pipe openings 92 are formed in the bulkhead 24 only for the two disk-drive guides 22 that are to be placed immediately adjacent the center disk-drive guide 22. The rear wall 94 of the bulkhead 24 has a plurality of openings 96 (only one of which is visible in FIG. 5), each opening 96 being sized to receive an edge connector (not shown). FIG. 6 shows a rear view of the bulkhead 24 to further illustrate the location of the plurality of connector openings 96 formed in the rear wall 94. In the embodiment shown, there are openings 96 for four connectors, one connector for each of the four columns of storage disk drives. Also formed in the rear wall 94 is a pair of openings 98 on opposite sides of each connector opening 96. Fasteners, such as screws, pass through these openings to secure the connectors to the rear wall 94.

Figure 7:
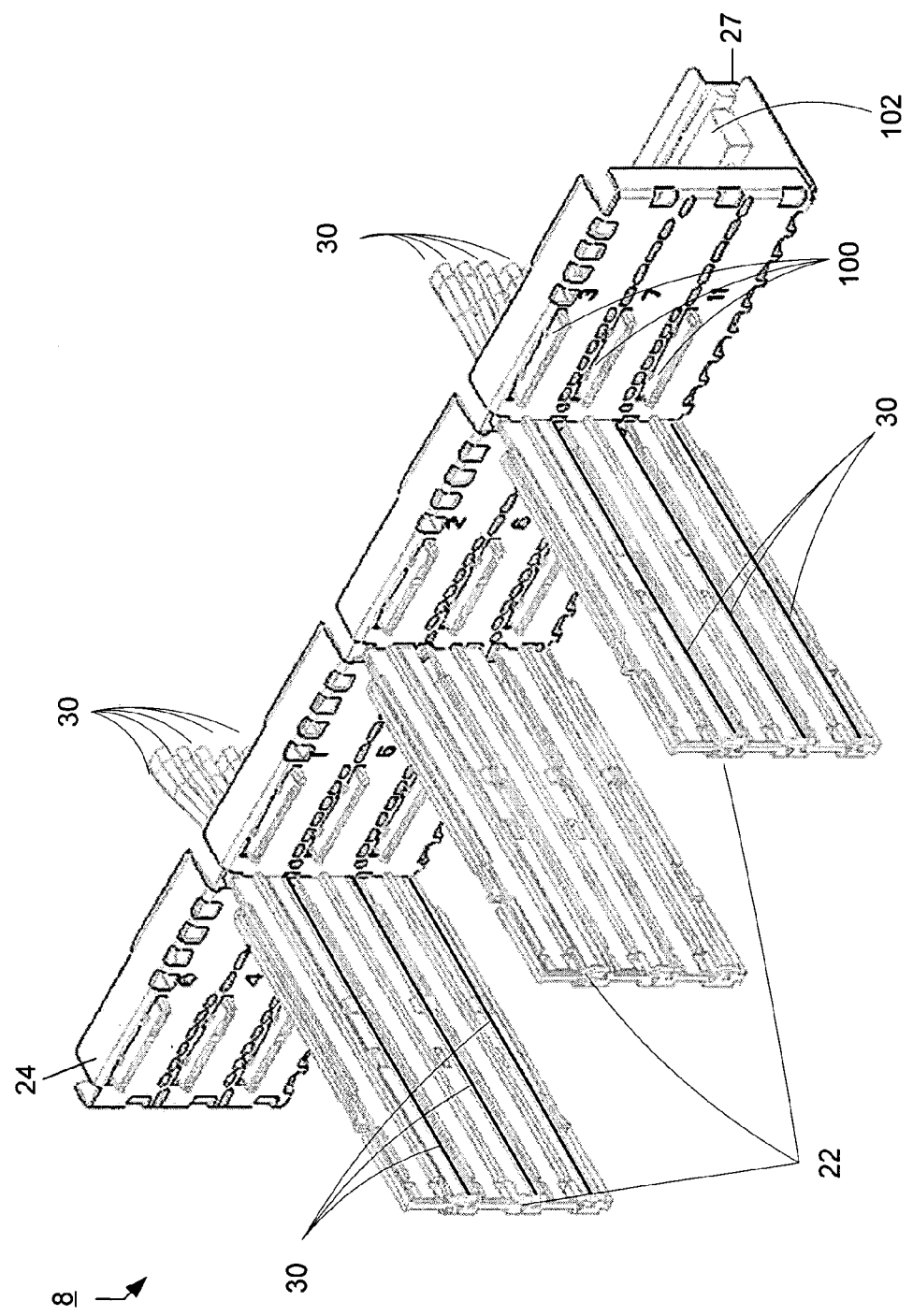
FIG. 7 is a front view of an embodiment of a bulkhead assembly including a plurality of storage rails attached to the bulkhead of FIG. 5.
Figure 8:
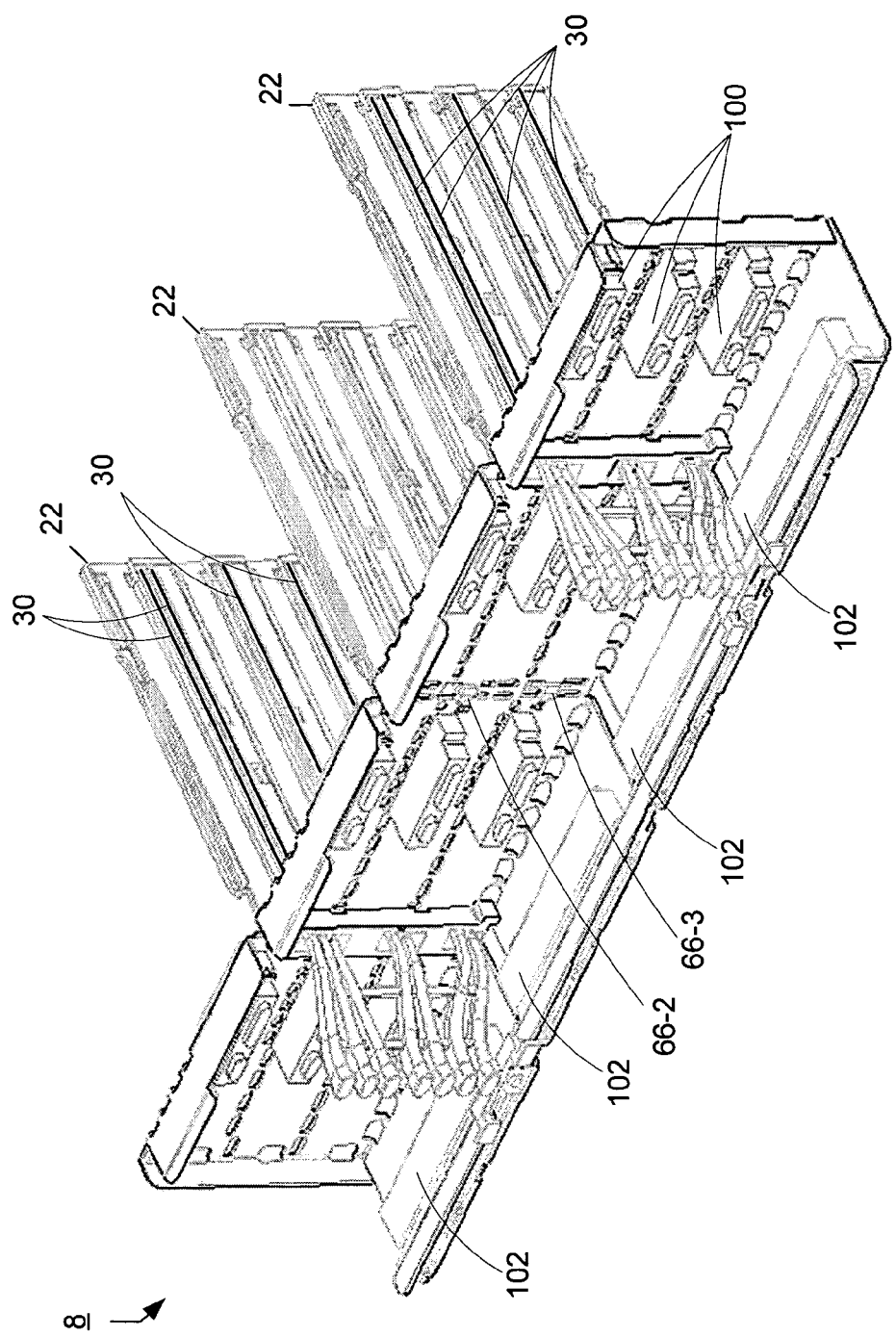
FIG. 8 is a rear view of the embodiment of the bulkhead assembly of FIG. 7, including a plurality of light pipes connected to the bulkhead.

FIG. 7 shows a front view of one embodiment of the bulkhead assembly 8 with three inner disk-drive guides 22 coupled to the front of the bulkhead 24. Light-pipes 30 extend through light-pipe channels in two of the three disk-drive guides 22 and project from the back of the bulkhead 24 to form two columns of seven light-pipes 30. Electrical connectors 100 are inserted into each of the connector openings 80 (FIG. 5), being pushed through the connector opening 80 from the rear side of the bulkhead 24, and secured to the bulkhead 24 by a fastener. In embodiments using Serial ATA disk drives, the electrical connectors 100 are standard Serial ATA connectors. Such connectors permit Serial ATA disk drives to be hot swapped, that is, inserted and removed while power is being supplied to the connector 100 for the disk drive. An edge connector 102 is also shown mounted to the rear wall 94 at one of the connector openings 96 (FIG. 6). FIG. 8 shows the bulkhead assembly 8 from a rear view to illustrate more clearly the two sets of seven light-pipes 30, the electrical connectors 100, and the edge connectors 102. There is one edge connector 102 for each column of electrical connectors 100. For each column, electrical ribbon cables or wires (not shown) electrically connect the three electrical connectors 100 to one edge connector 102 located at the base of that column. In the embodiment shown, four edge connectors 102 are shown, and each edge connector 102 makes an electrical connection to three SATA electrical connectors 100.

Figure 9:
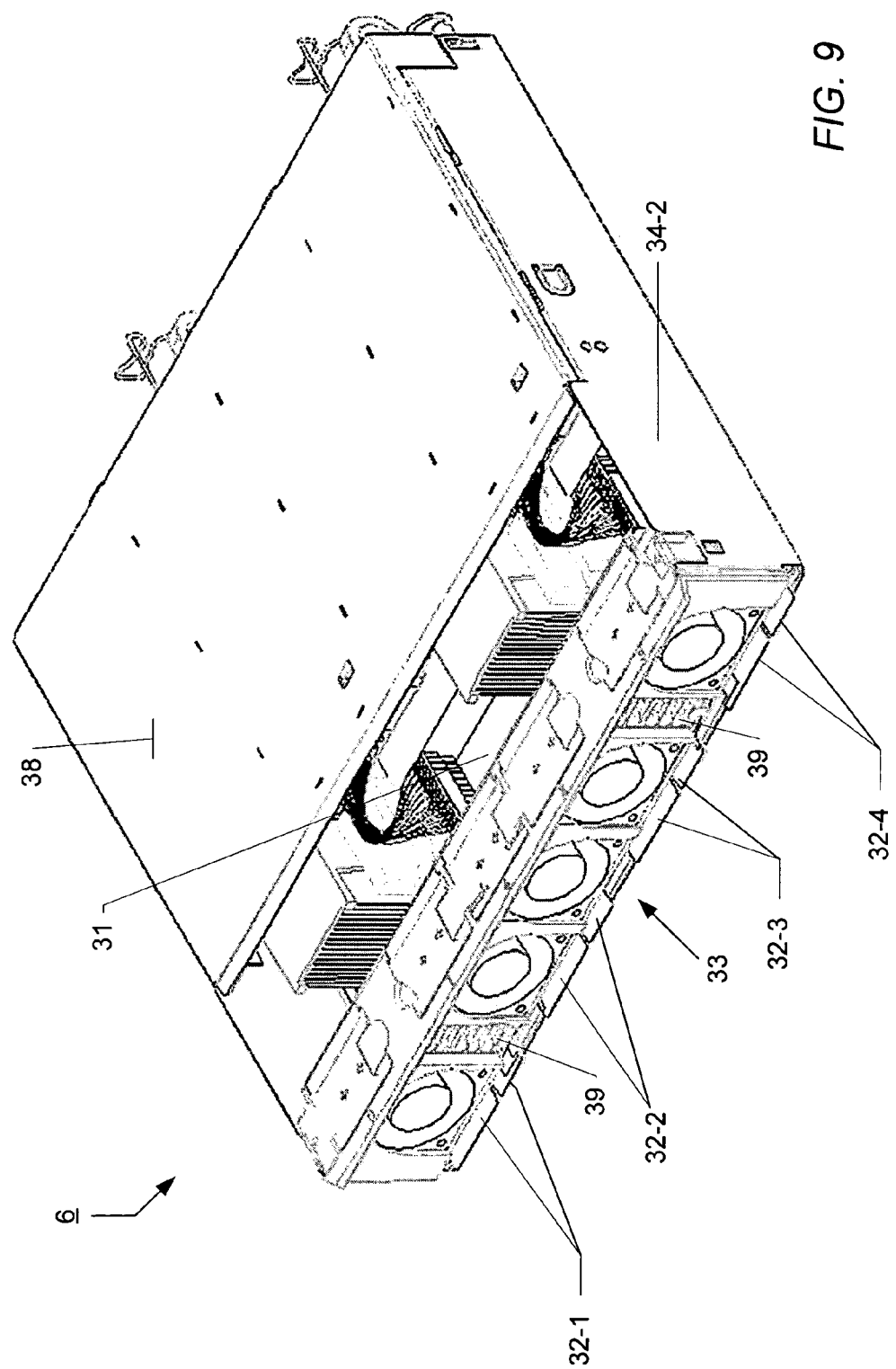
FIG. 9 is an isometric view of an embodiment of control board module including a fan assembly and LED modules.

FIG. 9 shows the control board module 6 of FIG. 1 in more detail, including the row of electrical finger connectors 32-1, 32-2, 32-3, 32-4 extending from the edge 33 of the processor board 31, the fan assembly 40 extending between the side walls 34-1, 34-2 at the edge 33 of the processor board, and the LED modules 39. Each edge connector 32 mates with a corresponding edge connector 102 mounted to the bulkhead assembly 8. Individual fans or the entire fan assembly 40 can be removed from the control board module 6.

Figure 10:
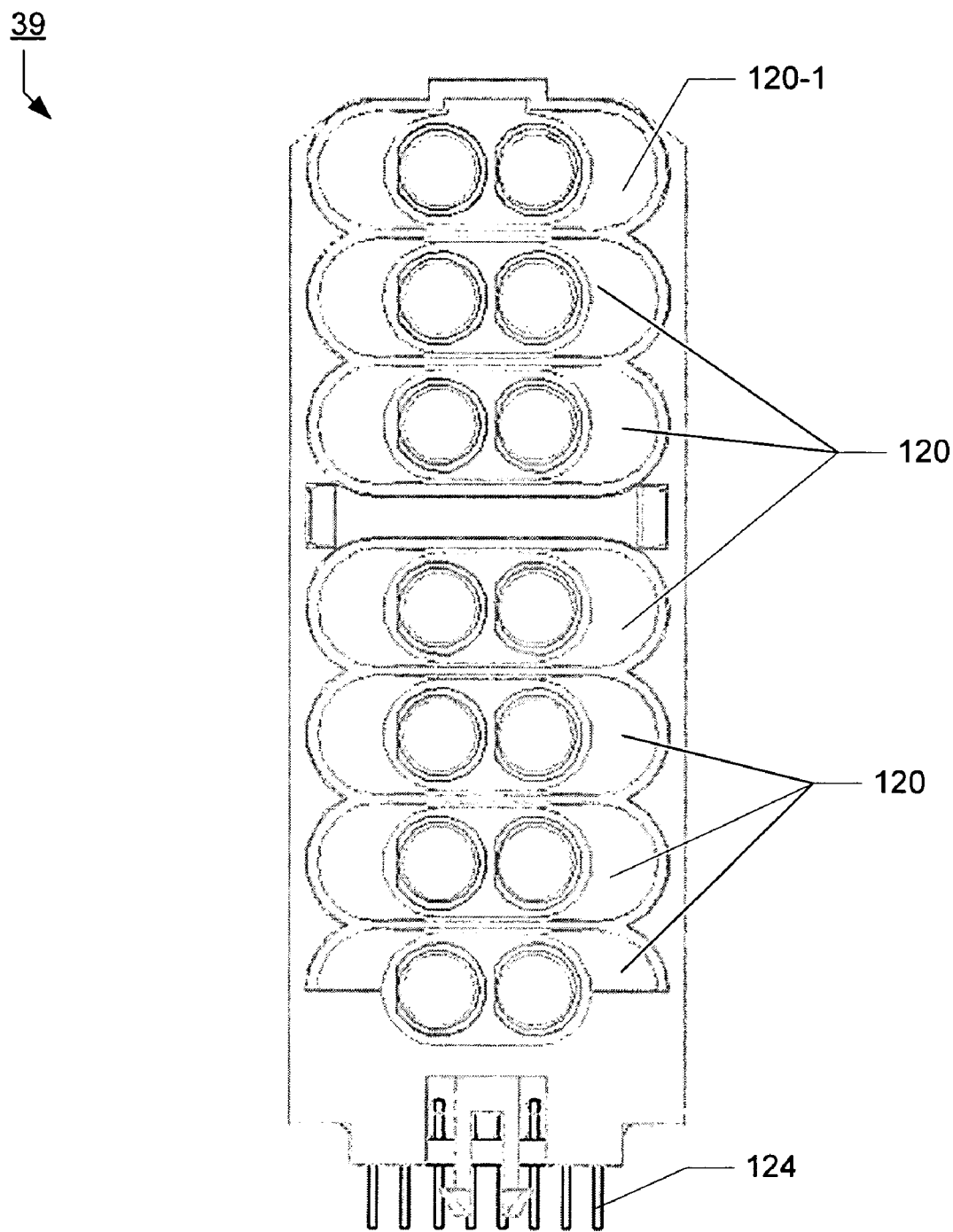
FIG. 10 is a front view of an embodiment of an LED module.

FIG. 10 shows a front view of an embodiment of an LED module 39. The LED module 39 includes a plurality of stacked pairs of LED pairs 120, a circuit board (not shown) connected to each LED, and a plurality of electrical pins 124 by which the LEDs are in electrical communication with the processor board 31 of the control board module 6. In this embodiment, the electrical pins 124 are arranged in two rows of eight pins, the back row being occluded in the figure by the front row.

The LED module 39 displaces the LEDs from the plane of the processor board 31 so that the LEDs can be appropriately aligned with the light-pipes 30. An oval open-faced casing surrounds each LED pair 120 for closely receiving one of the light-pipes 30 extending from the back side of the bulkhead assembly 8. The top LED pair 120-1 in the LED stack 39 corresponds to a system status and connects to the light-pipe 30 that abuts the system status window 74 on the front face of the storage disk drive guide 22. The remaining LED pairs in the LED stack 39 correspond to one of the storage disk drives 28. One LED of each pair 120 indicates a system or disk drive fault, e.g., an amber LED, and the other indicates that the system of disk drive is operating properly, e.g., a green or blue LED.

Figure 11:
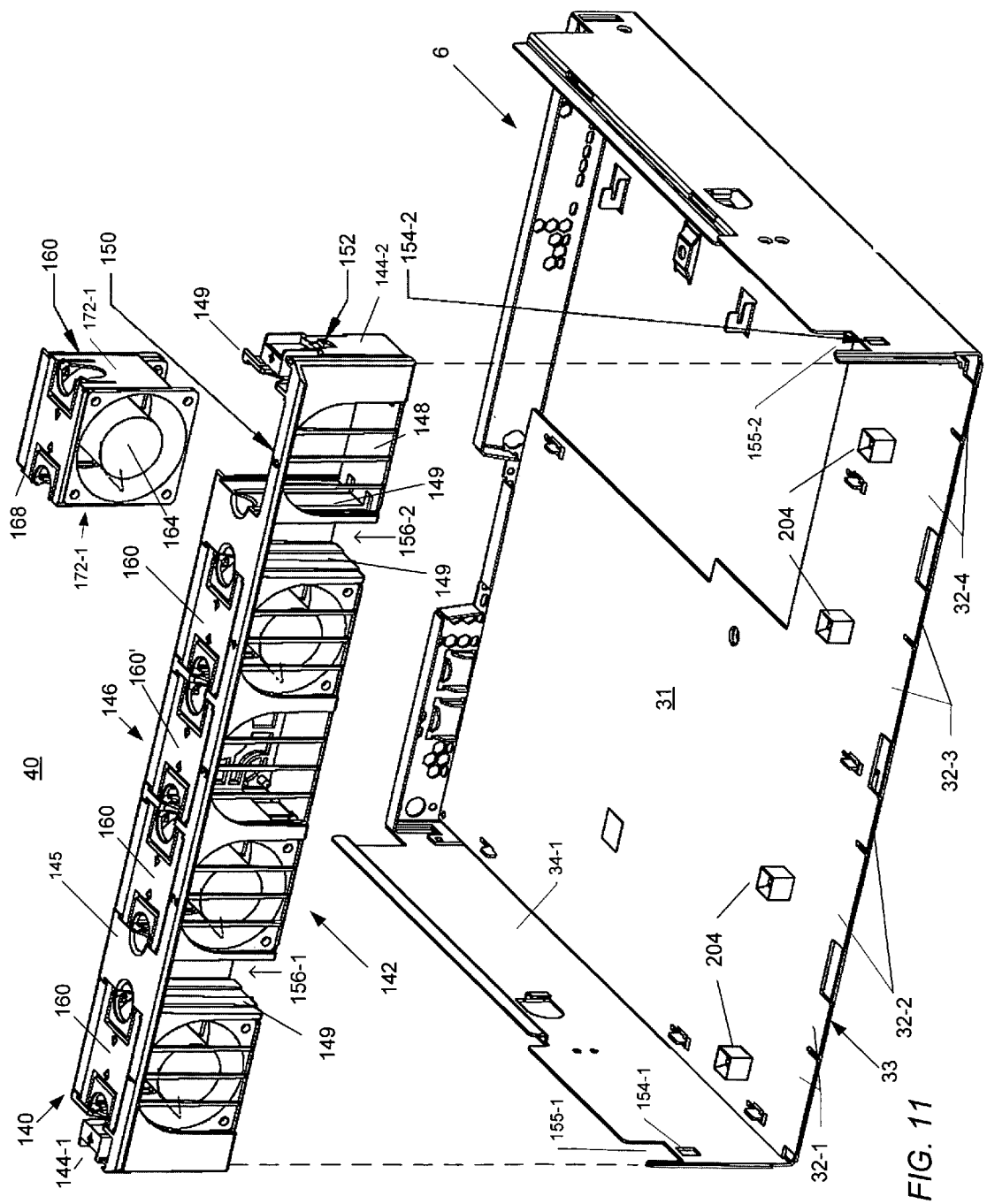
FIG. 11 is an exploded view of an embodiment of the fan assembly of FIG. 9.

FIG. 11 shows an exploded view of the fan assembly 40 having a support frame 140 with a front wall 142, flexible side columns 144-1, 144-2, a top side 145, a rear side 146, and a base 148. In one embodiment, the support frame 140 is constructed of plastic. The support frame 140 also includes inner side walls 149 that, together with the front wall 142 and base 148, define a plurality of wells 150 (only one of which is shown empty). The flexible side columns 144-1, 144-2 each have a tab 152 extending from an outer surface thereof (the tab 152 of column 144-1 is not visible in the figure).

When the fan assembly 40 is being installed into the control board module 6, the tabs 152 press against the side walls 34-1, 34-2 of the control board module 6, causing the side columns 144-1, 144-2 to flex inwardly (i.e., away from the side walls 34-1, 34-2). When the fan assembly 40 is slid sufficiently downwards into place, each tab 152 snaps into a respective opening 154-1, 154-2 in the side walls 34-1, 34-2, causing each side column 144-1, 144-2 to return to its non-flexed position. When the side columns 144-1.144-2 return to their non-flexed positions, a top portion of each side column 144-1, 144-2 enters a respective cutout section 155-1, 155-2 of the side walls 34-1,34-2. The side columns 144-1, 144-2, tabs 152 and side wall openings 154-1, 154-2 cooperate as a latch-and-release mechanism Variations of this latch-and-release mechanism can be employed to detachably secure the side columns 144-1, 144-2 to the side walls 34-1, 34-2. For example, one alternative embodiment can have tabs projecting from the inner surfaces of the side walls 34-1, 34-2 and corresponding openings in the side columns 144-1, 144-2.

Recessed compartments 156-1 and 156-2 in the front side 142 of the support frame 140 provide clearance for the LED modules 39 installed on the processor board 31 of the control board module 6 when the fan assembly 40 is installed. The back side of each recessed compartment 156-1, 156-2 is a solid surface (i.e., without openings or holes), to prevent back drafts.

To remove the fan assembly 40 from the control board module 6, an individual depresses the side columns 144-1, 144-2 inwardly (as indicated by the arrows) to disengage each tab 152 from its respective opening 154-1, 154-2 and vertically lifts the fan assembly 40 to disconnect it from the processor board 31. Accordingly, the fan assembly 40 can be manually installed in and removed from the control board module 6 without the use of hand tools, such as a screwdriver.

Figure 12:
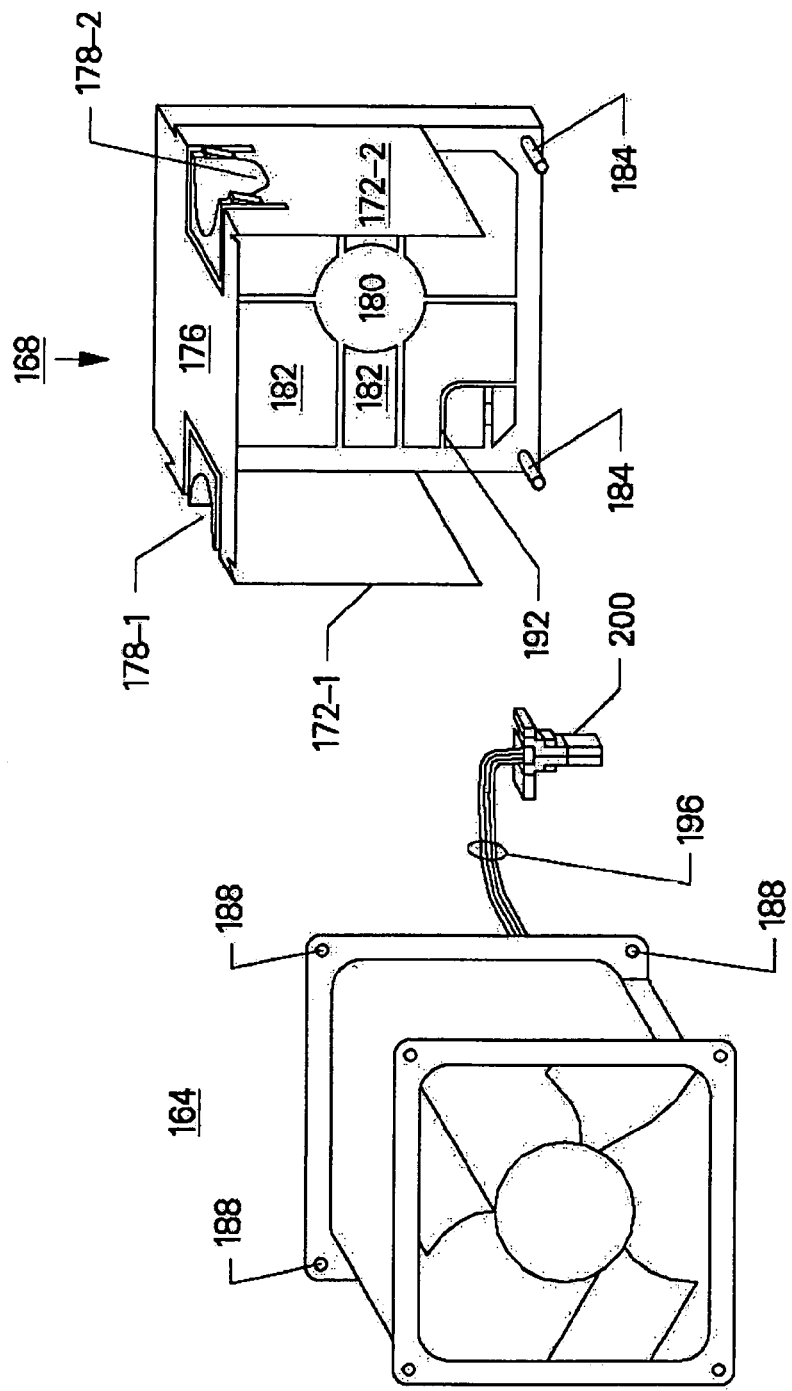
FIG. 12 is an exploded view of an embodiment of a fan pack including a fan and a fan mount.

Each well 150 can hold a fan pack 160. Each fan pack 160 includes a fan 164 attached to a fan mount 168 (FIG. 12). The fan packs 160 are modular in shape and size; each can be installed in any of the wells 150 of the support frame 140. Fan packs 160 slide into the wells 150 from the top side 145, with the bottom of each fan pack entering into the respective well 150 first. Any well 150 that does not receive a fan pack 160 receives a filler pack 160', which, in effect, is a fan mount 168 that is not attached to a fan 164. When the fan pack 160 is completely installed in a given well 150, the top surface of the fan pack 160 is flush with the top surface of the support frame 140.

FIG. 12 shows, in more detail, embodiments of the fan 164 and of the fan mount 168. The fan mount 168 has opposing side panels 172-1, 172-2, a top wall 176 between the side panels 172-1, 172-2, and a rear frame 180. The outer surface of each side panel 172-1, 172-2 has a pair of tabs 174 projecting outwardly therefrom (the tabs on side panel 172-1 are not visible in the figure). The rear frame 180 is perpendicular to each of the side panels 172-1, 172-2 and top wall 176. On opposing sides, flexible finger holes 178-1, 178-2 are formed in the side panels 172-1, 172-2 and top wall 176.

A plurality of flaps 182 are attached to the rear frame 180 for rotational movement about respective axes. The flaps 182 in FIG. 12 are each in a fully closed position. In the fully closed position, the flaps 182 fully cover the rear frame 180, and one flap 182 partially overlaps another one of the flaps 182. When the fan 164 is operating, moving air passes through the front side of the fan 164 out through the rear frame 180. The moving air urges the flaps 182 to open. At each corner of the rear frame 180 is a post 184 that extends orthogonally from the rear frame 180. Each post 184 snaps into a respective opening 188 of the fan 164 to attach the rear frame 180 and, thus, the fan mount 168, to the fan 164.

Also extending orthogonally from the rear frame 180 is a wire guard 192 that provides an egress for the electrical wires 196 of the fan 164. In one embodiment, there are three wires (ground, positive, and negative). The wires 196 terminate at an electrical connector 200 that is movably secured at one end of the wire guard 192 to produce a floating connector 200. The connector 200 is called floating because the connector 200 can move slightly from side to side, forwards, and backwards. This small amount of movement permits the connector 200 to obtain proper alignment with a connector 204 (FIG. 11) on the processor board 31 of the control board module 6. The fan assembly 140 can be installed into the control board module 6 while fully populated with fan packs 160 because the floating connector 200 of each fan pack 160 adjusts slightly to mate with the corresponding connector 204. Accordingly, every fan pack 160 in the fan assembly 140 at the time of installation makes electrical contact simultaneously to its corresponding connector 204.

Figure 13:
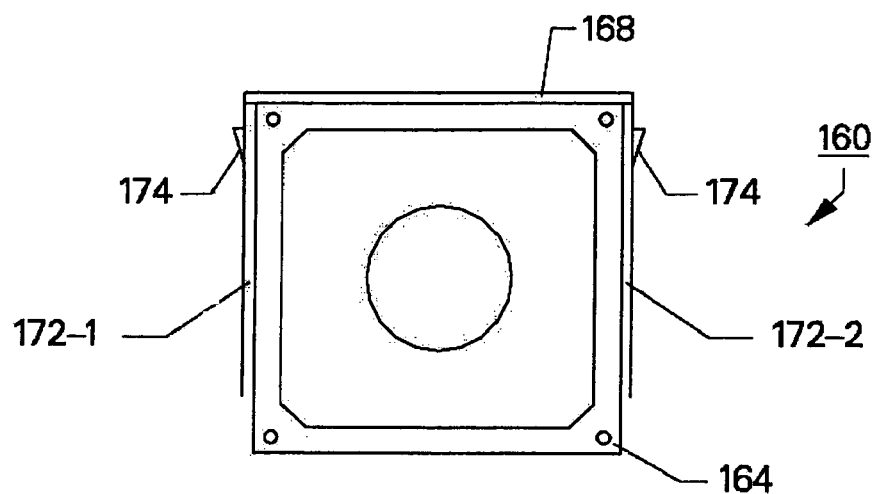
FIG. 13 is a front view of the fan pack.

When the fan pack 160 is individually inserted into one of the wells 150, the tabs 174 press against the side walls 149 of that well 150, causing the finger holes 178-1, 178-2 to bend inwardly. When the tabs 174 snap into respective grooves of the side walls 149, the flexible finger holes 178-1, 178-2 return to their non-depressed position, pressing the tabs 174 into the grooves. When pressed into the grooves, a planar edge of each tab 174 abuts a closed end of the groove, thus preventing the fan pack 160 from being slid upwards out of the well 150. (FIG. 13 shows a front view of the fan pack 160 with the fan 164 attached to the fan mount 168 and the tabs 174 extending from the side panels 172-1, 172-2.) The flexible finger holes 178-1, 178-2, tabs 152, and grooves in the side walls 149 of the well cooperate as a latch-and-release mechanism Variations of this latch-and-release mechanism can be employed to detachably secure the fan pack 160 within the well 150. For example, one alternative embodiment can have tabs projecting from the surfaces of the side walls 149 and corresponding openings or grooves in the side panels 172-1, 172-2 of the fan pack 160.

Pinching the flexible finger holes 178-1, 178-2 between a forefinger and thumb, to depress the finger holes 178-1, 178-2 towards each other in the direction of the arrows, disengages the tabs 174 from the grooves and permits the fan pack 160 to be withdrawn from the well 150 with a sliding motion. Together the finger holes 178-1, 178-2 serve as a type of handle for the fingers to grasp so the fan pack 160 can be pulled from the well 150. Accordingly, fan packs 160 can be individually inserted into and removed from wells 150 of the fan assembly without the use of tools, such as a screwdriver.

Figure 14:
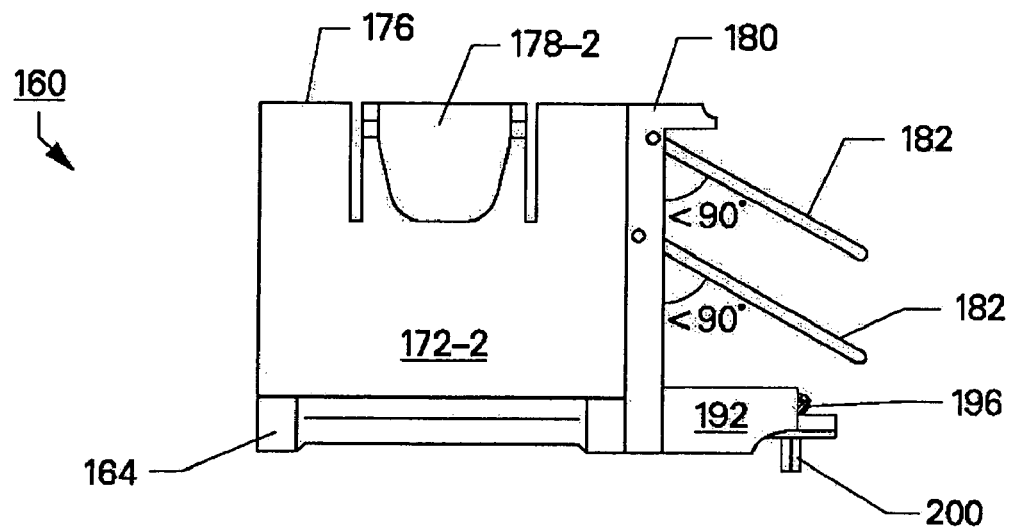
FIG. 14 is a side view of the fan pack.

FIG. 14 shows a side view of the fan pack 160. The flaps 182 pivotally attached to the rear frame 180 of the fan pack 160 are each in an open position. When fully open, the flaps 182 extend from the rear frame 180 at an angle that is less than 90 degrees with respect to the plane of the rear frame 180. Should the fan 164 not be functioning properly or at all, any air attempting to flow back through the fan 164 will come against the outer surfaces of the flaps 182 and urge them closed, thus preventing back draft and ensuring that the air moved by the other fans 164 in the fan assembly 40 continues to flow in the direction over the electronic components in the control board module 6. Usually, the data storage enclosure 2 is disposed horizontally, and the force of gravity assists in closing the flaps 182 when the fan 164 is not moving air. In some instances, the data storage enclosure 2 is disposed vertically (i.e., similar to a tower configuration), in which case the flaps 182 pivot from side to side, instead of up and down. Here, although without the assistance of gravity, the flaps 182 will not stay open, and instead will close, in the presence of a back draft because of the sub-90 degree angle.

FIG. 14 also shows in more detail the wire guard 192 extending orthogonally from the rear frame 180. The floating connector 200 emerges perpendicularly from an open end of the wire guard 192 and projects lower than the base of the fan pack 160. Consequently, the connector 200 can enter a corresponding connector 204 on the processor board 31 when the fan assembly 40 is installed into the control board module 6.

Figure 15A:
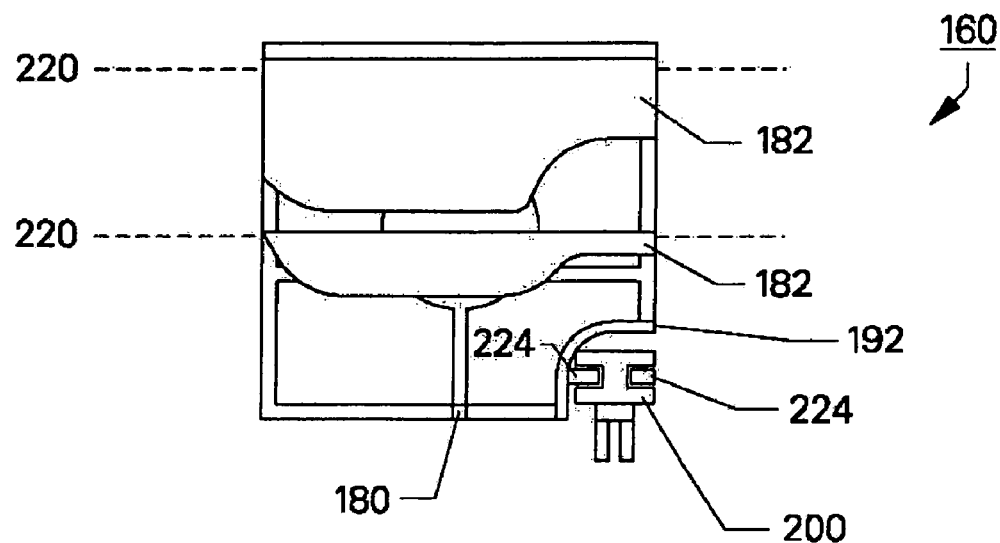
FIG. 15A and FIG. 15B are rear views of the fan pack with rear flaps open and closed, respectively.
Figure 15B:
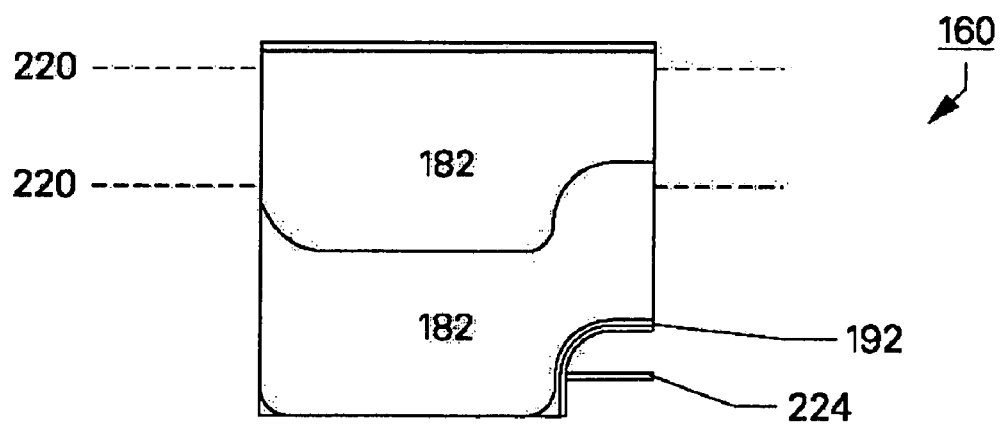

FIG. 15A and FIG. 15B show rear views of the fan pack 160 with the flaps 182 in open positions and in closed positions, respectively. Axes of rotation for the flaps 182 are shown by dashed lines 220. When closed, one of the flaps 182 overlaps the other flap 182 so that the rear frame 180 is completely covered. The shape of the flaps 182 accommodates the contour of the wire guard 192. Other embodiments can use a single flap or more than two flaps without departing from the principles of the invention. FIG. 15A also shows the floating connector 200 movably mounted on a ledge 224 extending from a side wall within the wire guard 192. The floating connector 200 is absent from FIG. 15B to illustrate the ledge 224 upon which the connector 200 rests.

Figure 16:
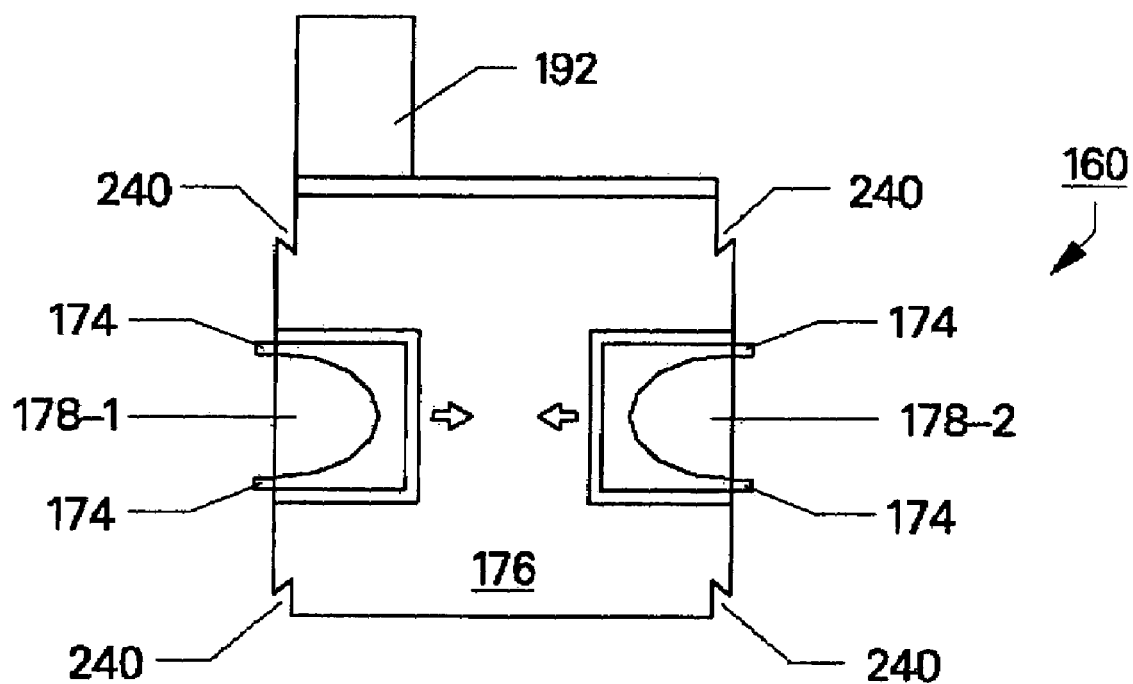
FIG. 16 is a top view of the fan pack.

FIG. 16 shows a top view of the fan pack 160, illustrating the finger holes 178-1 and 178-2. Notches 240 appear where the side panels 172-1, 172-2 meet the top wall 176. These notches 240 enable the side panels 172-1, 172-2 to slide into respective grooves in the side walls 149 of the well 150 when the fan pack 160 is inserted into the well 150.

While the invention has been shown and described with reference to specific preferred embodiments, it should be understood by those skilled in the art that various changes in form and detail may be made therein without departing from the spirit and scope of the invention as defined by the following claims.

The invention claimed is:

1. A fan assembly, comprising:
   a support frame having a base, a front wall extending perpendicular to the base, and a plurality of spatially separated side walls perpendicular to the base and to the front wall, the base, front wall, and side walls defining a plurality of wells;
   a plurality of fan packs, each fan pack including a fan and a fan mount attached to the fan, each fan pack being disposed in one of the plurality of wells the fan mount of each fan pack having a top wall and spatially separated opposing side panels, and a first latch-and-release mechanism for removably securing the fan pack to the side walls of the well within which that fan pack is disposed, the first latch-and-release mechanism including a flexible section in each side panel with a tab projecting outwardly therefrom, each flexible section forming part of the top wall with a cutout region formed therein, the cutout regions of the flexible sections providing opposing movable finger holes, the fan pack being individually removable from the well by using the finger holes to urge the flexible sections towards each other so that each outwardly projecting tab releases from the sidewall of the well to which that tab is latched; and
   a second latch-and-release mechanism securing the support frame to opposing side walls of an enclosure, the second latch-and-release mechanism enabling the fan assembly to be removed from the enclosure while populated with the plurality of fan packs.

2. The fan assembly of claim 1, wherein the first-latch-and-release mechanism of each fan pack includes flexible side panels of the fan mount, a tab projecting outwardly from an external surface of each side panel, and a recessed region in each side wall of the well within which that fan pack is disposed for receiving the tabs when the fan pack is installed in that well.

3. The fan assembly of claim 1, where in the second latch-and release mechanism includes a flexible side column on opposite ends of the support frame, a tab projecting from an inward facing surface of each side column, and openings in the side walls of the enclosure module for receiving a respective one of the tabs projecting from the flexible side columns.

4. The fan assembly of claim 1, wherein the fan mount of each fan pack has a rear side and a flap attached to the rear side for rotational movement between a closed position and a fully open position, the flap extending from the rear side at angle that is less than 90 degrees with respect to the rear side when the flap is in the fully open position.

5. The fan assembly of claim 1, wherein a pair of the side walls of the support frame define a recessed compartment within the front wall of the support frame for receiving an LED module.

6. The fan assembly of claim 1, wherein a base of each fan packs enters first into one of the wells when that fan pack is being slid into that well.

7. A fan pack for use in a fan assembly having a plurality of wells, the fan pack comprising:

a fan; and a fan mount coupled to the fan, the fan mount having a top wall, spatially separated opposing side panels, and a rear frame separating the side panels, the side panels and rear frame extending generally perpendicularly from the top wall, each side panel having a flexible section with a tab projecting outwardly therefrom for latching to a sidewall of a well in the fan assembly, each flexible section forming part of the top wall with a cutout region formed therein, the cutout regions of the flexible sections providing opposing movable finger holes, the fan pack being removable from the well by using the finger holes to urge the flexible sections towards each other so that each outwardly projecting tab disengages from the sidewall of the well to which that tab is latched, the rear frame of the fan mount having a flap mechanism pivotally attached thereto for rotational movement between a closed position and a fully open position, the flap mechanism covering the rear frame when in the closed position, and extending away from the rear frame at an angle of less than 90 degrees when in the fully open position to ensure that any back draft urges the flap mechanism towards the closed position.

8. The fan pack of claim 7, wherein the flap mechanism includes a plurality of flaps pivotally attached to the rear frame for rotational movement between the closed position and the fully open position.

9. The fan pack of claim 8, wherein one of the flaps partially overlaps another of the flaps when the flaps are in the closed position.

10. The fan pack of claim 7, further comprising a floating connector extending from the rear frame of the fan mount.

11. The fan pack of claim 7, wherein the fan mount has a notch where each side panel meets the rear frame, each notch sliding into a respective groove in a sidewall of the well of the fan assembly to position the fan pack within the well.

12. The fan assembly of claim 1, further comprising a filler pack having a fan mount with a top wall, opposing side panels, and a rear frame separating the side panels, the side panels and rear frame extending generally perpendicularly from the top wall, the filler pack being installed without a fan in one of the wells, the rear frame of the filler pack having a flap mechanism in a closed position to prevent reverse air flow from passing through a well unoccupied by a fan.

* * * * *